(12) United States Patent
Chang et al.

(10) Patent No.: US 8,518,533 B2
(45) Date of Patent: Aug. 27, 2013

(54) COATING, ARTICLE COATED WITH COATING, AND METHOD FOR MANUFACTURING ARTICLE

(75) Inventors: Hsin-Pei Chang, Tu-Cheng (TW); Wen-Rong Chen, Tu-Cheng (TW); Huann-Wu Chiang, Tu-Cheng (TW); Cheng-Shi Chen, Tu-Cheng (TW); Zhi-Jie Hu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 203 days.

(21) Appl. No.: 13/008,987

(22) Filed: Jan. 19, 2011

(65) Prior Publication Data
US 2012/0040163 A1 Feb. 16, 2012

(30) Foreign Application Priority Data

Aug. 16, 2010 (CN) .......................... 2010 1 0254315

(51) Int. Cl.
*B32B 9/00* (2006.01)
(52) U.S. Cl.
USPC ........... 428/336; 428/469; 428/472; 428/697; 428/698; 428/699

(58) Field of Classification Search
USPC .................. 428/336, 469, 472, 697, 698, 699
See application file for complete search history.

(56) References Cited

U.S. PATENT DOCUMENTS

| | | | | |
|---|---|---|---|---|
| 3,900,592 | A | * | 8/1975 | Kennedy et al. .............. 428/212 |
| 7,033,682 | B1 | * | 4/2006 | Rai et al. ........................ 428/697 |
| 7,081,186 | B2 | * | 7/2006 | Ehiasarian et al. ...... 204/192.12 |

OTHER PUBLICATIONS

Musil et al "Hard nanocomposte Zr-Y-N coatings, correlation between hardnes and structure" Surface & Coatings Tech 127 (2000) p. 99-106.*
Larjani et al "The effect of carbon in Zr(C,N) films o the nano-structural peroperties and hardness" Journal of Alloys & Compounds 492 (2010) p. 735-738.*
Silva et al "Structure-property realtions in ZrCN coatings for tribological applications" Surface & Coatings Tech 205 (2010) p. 2134-2141.*

* cited by examiner

*Primary Examiner* — Archene Turner
(74) *Attorney, Agent, or Firm* — Altis Law Group, Inc.

(57) ABSTRACT

A coating includes a zirconium yttrium carbon-nitride layer including a first surface and an opposite second surface, the atomic carbon content and the atomic nitrogen content in the zirconium yttrium carbon-nitride layer gradually increasing from the first surface to the second surface.

6 Claims, 4 Drawing Sheets

COATING, ARTICLE COATED WITH COATING, AND METHOD FOR MANUFACTURING ARTICLE

CROSS-REFERENCE TO RELATED APPLICATIONS

The present application is related to co-pending U.S. patent application Ser. Nos. 13/008,984 and 13/008,991), entitled "COATING, ARTICLE COATED WITH COATING, AND METHOD FOR MANUFACTURING ARTICLE", by Zhang et al. These applications have the same assignee as the present application and has been concurrently filed herewith. The above-identified applications are incorporated herein by reference.

BACKGROUND

1. Technical Field

The exemplary disclosure generally relates to coatings, and particularly relates to articles coated with the coatings and method for manufacturing the articles.

2. Description of Related Art

Physical vapor deposition (PVD) has conventionally been used to form a coating on metal bases of cutting tools or molds. Materials used as this coating material are required to have excellent hardness and toughness. Presently, Titanium nitride (TiN) and Titanium-aluminum nitride (TiAlN) are mainly used as a material satisfying these requirements. However, these coating materials have a low hardness and a low temperature oxidation resistance.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coating, article coated with the coating and method for manufacturing the article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
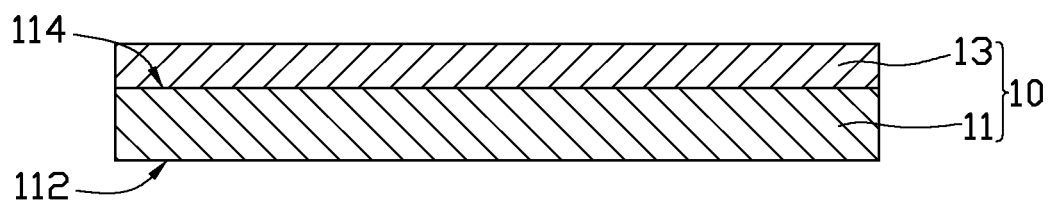
FIG. 1 is a cross-sectional view of an exemplary embodiment of coating.

Referring to FIG. 1, a coating 10 includes a zirconium yttrium carbon-nitride (ZrYCN) layer 11. The ZrYCN layer 11 may be deposited by magnetron sputtering. The ZrYCN layer 11 has a thickness ranging from about 0.7 micrometers to about 2.5 micrometers. The ZrYCN layer 11 includes a first surface 112 and an opposite second surface 114. The atomic carbon content and the atomic nitrogen content in the ZrYCN layer 11 both gradually increase from the first surface 112 to the second surface 114. The coating 10 may also include a color layer 13 covering on the second surface 114 of the ZrYCN layer 11, to decorate the appearance of the coating 10.

Figure 2:
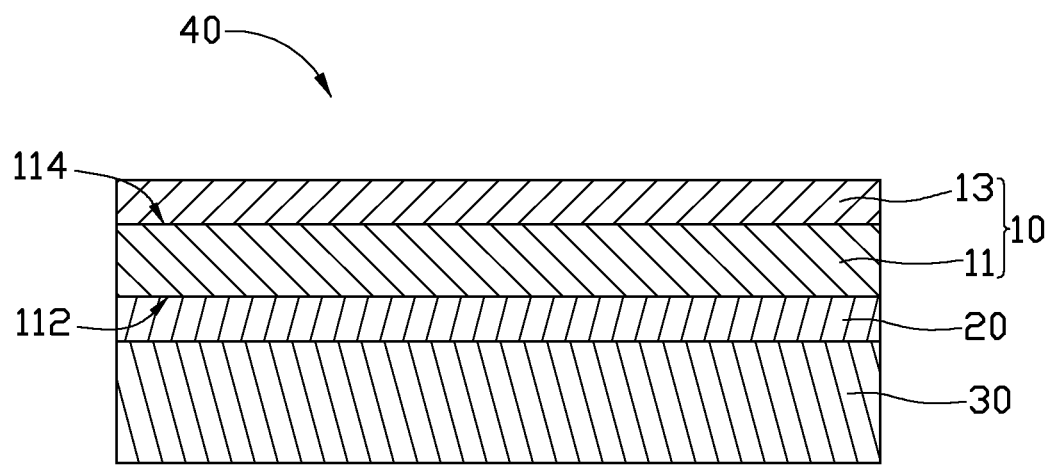
FIG. 2 is a cross-sectional view of an article coated with the coating in FIG. 1.

Referring to FIG. 2, an exemplary article 40 includes a substrate 30, a bonding layer 20 deposited on the substrate 30 and the coating 10 deposited on bonding layer 20. The first surface 112 of the coating 10 covers on the bonding layer 20. The substrate 30 is made of a metal, such as high speed steel, hard alloy, or stainless steel. The article 40 may be cutting tools, molds, or housings of electronic devices. The bonding layer 20 is a zirconium yttrium (ZrY) layer. The bonding layer 20 has a thickness ranging from about 50 nanometers to about 300 micrometers. The bonding layer 20 can be deposited by magnetron sputtering. The chemical stability of the bonding layer 20 is between the chemical stability of the substrate 30 and the chemical stability of the coating 10, and the coefficient of thermal expansion of the bonding layer 20 is between the coefficient of thermal expansion of the substrate 30 and the coefficient of thermal expansion of the coating 10. Thus, the bonding layer 20 is used to improve binding force between the substrate 30 and the coating 10 so the coating 10 can be firmly deposited on the substrate 30.

Figure 3:
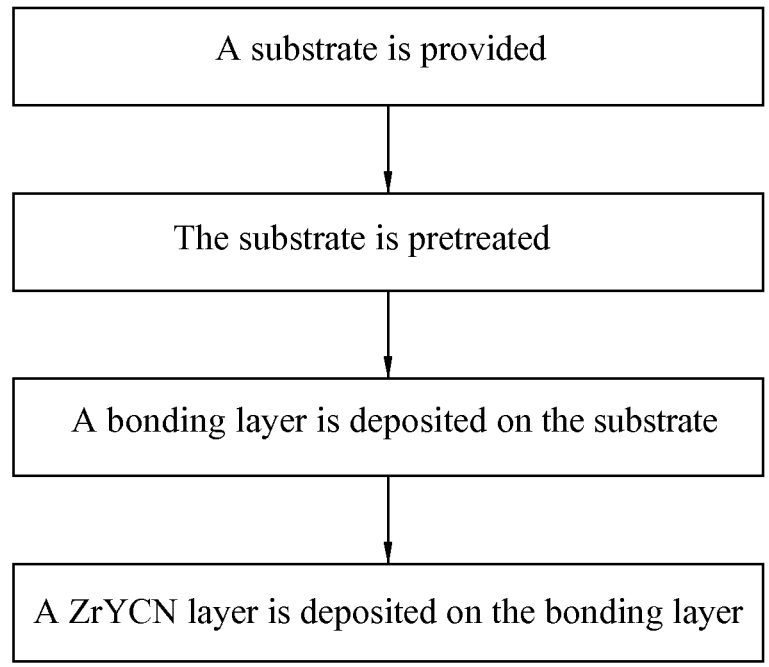
FIG. 3 is a block diagram of a method for manufacturing an article coated with the coating in FIG. 1.
Figure 4:
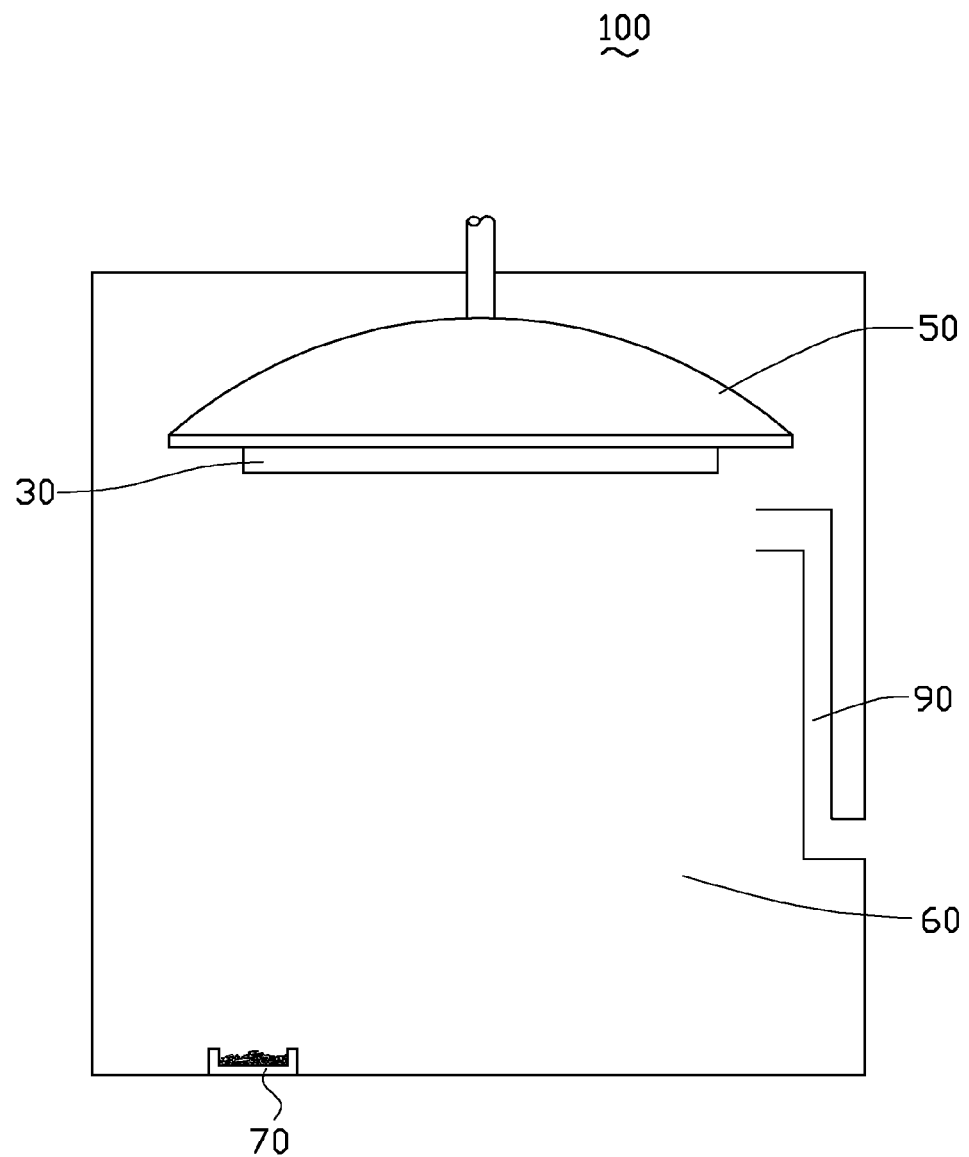
FIG. 4 is a schematic view of a magnetron sputtering coating machine for manufacturing the article in FIG. 2.

Referring to FIG. 3, a method for manufacturing the article 40 may include at least the steps of:

Providing a substrate 30, the substrate 30 may be made of high speed steel, hard alloy, or stainless steel.

Pretreating the substrate 30, by cleaning the substrate 30 using deionized water and alcohol successively. The substrate 30 is then washed with a solution (e.g., Alcohol or Acetone) in an ultrasonic cleaner, to remove impurities, e.g., grease, or dirt. The substrate 30 is dried. The substrate 30 is cleaned by argon plasma cleaning. The substrate 30 is retained on a rotating bracket 50 in a vacuum chamber 60 of a magnetron sputtering coating machine 100. The vacuum level of the vacuum chamber 60 is adjusted to about 8.0×10-3 Pa, pure argon is fed into the vacuum chamber 60 at a flux of about 250 Standard Cubic Centimeters per Minute (sccm) to 500 sccm from a gas inlet 90. A bias voltage is applied to the substrate 30 in a range from about −300 to about −500 volts for about 10 to about 15 minutes. Therefore, the substrate 30 is washed by argon plasma, to further remove the grease or dirt. Thus, the binding force between the substrate 30 and the coating 10 is enhanced.

A bonding layer 20 is deposited on the substrate 30. The temperature in the vacuum chamber 60 is adjusted from about 150 to about 400° C. (Celsius degree); the argon is fed into the vacuum chamber 60 at a flux from about 100 sccm to about 200 sccm from the gas inlet 90, in this embodiment, at about 150 sccm; a zirconium yttrium alloy target 70 in the vacuum chamber 60 is evaporated; a bias voltage applied to the substrate 30 may be in a range from about −100 to about −250 volts, for about 5 to about 10 min, to deposit the bonding layer 20 on the substrate 30. The zirconium yttrium alloy target 70 contains atomic yttrium in a range from about 0.3 to about 5 wt %.

A ZrYCN layer 11 is deposited on the bonding layer 20. The temperature in the vacuum chamber 60 is kept at about 150 to about 400° C.; argon is fed into the vacuum chamber 60 at a flux from about 100 sccm to about 200 sccm, methane is fed into the vacuum chamber 60 at a flux from about 5 sccm to about 5 sccm and nitrogen is fed into the vacuum chamber 60 at a flux from about 10 sccm to about 20 sccm from the gas inlet 90; zirconium yttrium alloy target 70 is evaporated; a bias voltage applied to the substrate 30 may be in a range from about −150 to about −500 volts, for about 45 to about 150 min, to deposit the ZrYCN layer 11 on the bonding layer 20. During the depositing of the ZrYCN layer 11 on the bonding layer 20, the flux of the nitrogen and the flux of the methane are both increased from about 15 sccm to about 20 sccm every 15 minutes. Thus, the atomic carbon content and the atomic nitrogen content in the ZrYCN layer 11 both gradually increase from the first surface 112 to the second surface 114. In other words, the atomic carbon content and the atomic nitrogen content in the ZrYCN layer 11 both gradually increase from near the bonding layer 20 to away from the bonding layer 20.

It is to be understood that the color layer 13 may be deposited on the ZrYCN layer 11 to improve the appearance of the article 40.

During depositing the ZrYCN layer 11, atomic yttrium cannot react with atomic zirconium, atomic carbon and atomic nitrogen to form solid solution phrase, and atomic yttrium independently forms a copper phase, which can prevent the zirconium carbon-nitride crystal from enlarging, to maintain the zirconium-nitrogen crystal at nanometer level. The nanometer level zirconium-nitrogen crystal can improve hardness and endurance of the coating 30.

When the article 40 is located in high temperature and oxygen environment, the atomic yttrium in the ZrYCN layer 11 can prevent exterior oxygen from diffusing in the ZrYCN layer 11. Thus, the ZrYCN layer 11 can make the coating 10 have high temperature oxidation resistance.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An article, comprising:
   a metal substrate;
   a bonding layer formed on and in contact with the metal substrate, the bonding layer being a zirconium yttrium layer; and
   a coating formed on and in contact with the bonding layer, the coating comprising:
      a zirconium yttrium carbon-nitride layer including a first surface covering the bonding layer and an opposite second surface, the atomic carbon content and the atomic nitrogen content in the zirconium yttrium carbon-nitride layer gradually increasing from the first surface to the second surface.

2. The article as claimed in claim 1, wherein the zirconium yttrium carbon-nitride layer is deposited by magnetron sputtering, using zirconium yttrium alloy target containing atomic yttrium in a range from about 0.3 to about 5 wt %.

3. The article as claimed in claim 1, wherein the zirconium yttrium carbon-nitride layer has a thickness ranging from about 0.7 micrometers to about 2.5 micrometers.

4. The article as claimed in claim 1, wherein the coating further comprising comprises a color layer covering on the second surface of the zirconium yttrium carbon-nitride layer.

5. The article as claimed in claim 1, wherein the bonding layer is a zirconium yttrium layer and having has a thickness ranging from about 50 nanometers to about 300 micrometers.

6. The article as claimed in claim 5, wherein the bonding layer is deposited by magnetron sputtering, using a zirconium yttrium alloy target contains atomic yttrium in a range from about 0.3 to about 5 wt %.

\* \* \* \* \*